US012751207B2

(12) United States Patent
Kurose et al.

(10) Patent No.: US 12,751,207 B2
(45) Date of Patent: Sep. 29, 2026

(54) THERMOELECTRIC CONVERSION ELEMENT AND SENSOR

(71) Applicant: NITTO DENKO CORPORATION, Ibaraki (JP)

(72) Inventors: Manami Kurose, Ibaraki (JP); Yosuke Nakanishi, Ibaraki (JP); Hirokazu Tanaka, Ibaraki (JP); Hironobu Machinaga, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 230 days.

(21) Appl. No.: 18/695,936

(22) PCT Filed: Sep. 27, 2022

(86) PCT No.: PCT/JP2022/036045
§ 371 (c)(1),
(2) Date: Mar. 27, 2024

(87) PCT Pub. No.: WO2023/054416
PCT Pub. Date: Apr. 6, 2023

(65) Prior Publication Data

US 2025/0008841 A1 Jan. 2, 2025

(30) Foreign Application Priority Data

Sep. 29, 2021 (JP) ................................ 2021-159974

(51) Int. Cl.
*H10N 15/20* (2023.01)

(52) U.S. Cl.
CPC .................................. *H10N 15/20* (2023.02)

(58) Field of Classification Search
None
See application file for complete search history.

(56) References Cited

U.S. PATENT DOCUMENTS

| | | | | |
|---|---|---|---|---|
| 2018/0331273 | A1* | 11/2018 | Kirihara | H10N 15/00 |
| 2020/0212282 | A1 | 7/2020 | Nakatsuji et al. | |
| 2022/0246820 | A1 | 8/2022 | Nakatsuji et al. | |
| 2024/0068881 | A1* | 2/2024 | Maeda | G01K 7/02 |

FOREIGN PATENT DOCUMENTS

| | | | | |
|---|---|---|---|---|
| JP | 2014-72256 A | 4/2014 | | |
| WO | WO-0217406 A1 * | 2/2002 | | H10N 15/00 |
| WO | 2017/082266 A1 | 5/2017 | | |

(Continued)

OTHER PUBLICATIONS

Machine translation of WO0217406A1 (Year: 2002).*

(Continued)

*Primary Examiner* — Ryan S Cannon
(74) *Attorney, Agent, or Firm* — Hauptman Ham, LLP

(57) ABSTRACT

A thermoelectric conversion element includes a magneto-thermoelectric conversion body and a wiring. The magneto-thermoelectric conversion body linearly extends. The wiring is electrically connected to the magneto-thermoelectric conversion body. In the thermoelectric conversion element, an absolute value |ΔS| of a difference between a Seebeck coefficient Sm in the length direction of the magneto-thermoelectric conversion body and a Seebeck coefficient Sc in the length direction of the wiring is 10 μV/K or less.

13 Claims, 2 Drawing Sheets

(56) References Cited

FOREIGN PATENT DOCUMENTS

| | | | |
|---|---|---|---|
| WO | 2019/009308 | A1 | 1/2019 |
| WO | 2020/218613 | A1 | 10/2020 |

OTHER PUBLICATIONS

Korean Office Action issued on Nov. 28, 2025, for corresponding Korean Patent Application No. 10-2024-7010503, with its English machine translation, 12 pages.

Extended European Search Report issued on Aug. 11, 2025 for corresponding European Patent Application No. 22876282.9 (9 pages).

Sakai et al., "Iron-based binary ferromagnets for transverse thermoelectric conversion", Nature, Apr. 27, 2020, vol. 581, 18 Pages, cited in NPL No. 1.

Sakuraba et al: "Anomalous Nernst Effect in L1 0-FePt/MnGa Thermopiles for New Thermoelectric Applications", Applied Physics Express, vol. 6, Mar. 1, 2013, pp. 033003-1-033003-4, cited in NPL No. 1.

International Search Report issued for corresponding International Patent Application No. PCT/JP2022/036045 on Dec. 13, 2022, along with an English translation (5 pages).

Written Opinion issued for corresponding International Patent Application No. PCT/JP2022/036045 on Dec. 13, 2022 (4 pages).

Office Action issued on Jul. 28, 2026 for corresponding Japanese Patent Application No. 2023-551564, along with an English machine translation (12 pages).

* cited by examiner

THERMOELECTRIC CONVERSION ELEMENT AND SENSOR

CROSS REFERENCE TO RELATED APPLICATION

This application is a National Stage of International Application No. PCT/JP2022/036045, filed on Sep. 27, 2022, which designates the United States and was published in Japan, and which is based upon and claims priority to Japanese Patent Application No. 2021-159974, filed on Sep. 29, 2021 in the Japan Patent Office. All of the aforementioned applications are hereby incorporated by reference in their entireties.

TECHNICAL FIELD

The present invention relates to a thermoelectric conversion element and a sensor.

BACKGROUND ART

Techniques relating to magneto-thermoelectric conversion have been known.

For instance, Patent Literature 1 describes a thermoelectric generation device utilizing an anomalous Nernst effect. The anomalous Nernst effect is a phenomenon that a voltage is generated in a direction orthogonal to both a magnetization direction and a temperature gradient when a temperature difference is caused by a heat flow through a magnetic body.

This thermoelectric generation device includes a substrate, a power generation body, and a connection body. The power generation body is formed of a plurality of thin wires disposed in parallel to each other along a surface of the substrate. Each thin wire is formed by shaping an FePt thin film formed on the substrate, and the thin wires are magnetized in the width direction. The power generation body is configured to generate electricity using a temperature difference in the direction perpendicular to the direction of magnetization due to the anomalous Nernst effect. The connection body is formed of a plurality of thin wires disposed along the surface of the substrate, parallel to and between the respective thin wires of the power generation body. Each thin wire of the connection body electrically connects one end part of each thin wire of the power generation body to an end part of another thin wire adjacent on one side to the first-described thin wire. In this way, the connection body electrically connects the respective thin wires of the power generation body in series. The connection body is, for instance, formed of Cr as a non-magnetic body.

CITATION LIST

Patent Literature

JP 2014-072256 A

SUMMARY OF INVENTION

Technical Problem

In monitoring of physical condition in the Internet of Things (IoT) society or in thermal management in the technical field such as batteries for electric vehicle (EV) or chips for high-speed data processing, the needs for heat monitoring have been increased. For complying with such needs, use of a thermoelectric conversion element for thermal sensing may be taken into consideration.

It is understood that a thermoelectric conversion device utilizing magneto-thermoelectric conversion, such as the thermoelectric conversion device described in Patent Literature 1, can be manufactured more easily than a thermoelectric generation device utilizing the Seebeck effect. Taking these advantages into consideration, it is conceivable to use a thermoelectric conversion element utilizing magneto-thermoelectric conversion for heat sensing.

In the thermoelectric conversion device described in Patent Literature 1, the power generation body is configured to generate electricity using a temperature difference in a direction perpendicular to the direction of magnetization. On the other hand, in a thermoelectric conversion element utilizing magneto-thermoelectric conversion, it is assumed that an electromotive force is generated by a mechanism different from that of the magneto-thermoelectric conversion. For instance, in the thermoelectric conversion device described in Patent Literature 1, when a temperature gradient occurs in the length direction of thin wires of a power generation body made of FePt thin film and thin wires of a connection body made of a non-magnetic body of Cr, a thermal electromotive force due to the Seebeck effect can occur in the length direction due to the difference between the Seebeck coefficient of the FePt and the Seebeck coefficient of the Cr. Generation of the thermal electromotive force is probably not advantageous from the viewpoint of thermal sensing accuracy, because the electromotive force due to the Seebeck effect is superimposed on the electromotive force caused by the magneto-thermoelectric conversion. In addition to that, in the thermoelectric conversion device described in Patent Literature 1, a connection body formed of a plurality of thin wires is electrically connected in series to the power generation body made of a plurality of thin wires in order to increase the thermal electromotive force due to the magneto-thermoelectric effect. In such a configuration, the electromotive force due to the Seebeck effect tends to increase, which may have a significant impact on the accuracy of thermal sensing.

The magneto-thermoelectric coefficient $S_{ne}$ is expressed by a relational expression $S_{ne}=\rho_{xx}\alpha_{xy}-S_{se}\cdot\sigma_{xy}/\sigma_{xx}$, using an electrical resistivity $\rho_{xx}$, a transverse magneto-thermoelectric coefficient $\alpha_{xy}$, a Seebeck coefficient $S_{se}$, and hole conductivities $\sigma_{xy}$ and $\sigma_{xx}$. Therefore, from the viewpoint of improving the performance of magneto-thermoelectric conversion, it is understood that a material with a large absolute value of Seebeck coefficient $S_{se}$ is advantageous. Use of a material with a large Seebeck coefficient $S_{se}$ may increase the magneto-thermoelectric coefficient $S_{ne}$, thereby improving the thermoelectric conversion performance. Meanwhile, a material with a large Seebeck coefficient $S_{se}$ tends to generate electromotive force due to a temperature difference in the in-plane direction, which tends to affect the accuracy of thermal sensing. Attempts have been made to apply Heusler alloys or the like represented by $Co_2MnGa$, which have a large Seebeck $S_{se}$ coefficient, to magneto-thermoelectric conversion elements, but no consideration has been given to dealing with such issues.

In view of such circumstances, the present invention provides a thermoelectric conversion element that is advantageous from the viewpoint of improving the accuracy of heat sensing while utilizing the magneto-thermoelectric conversion.

Solution to Problem

The present invention provides a thermoelectric conversion element including:

a magneto-thermoelectric conversion body extending linearly; and a wiring electrically connected to the magneto-thermoelectric conversion body, wherein an absolute value of a difference between a Seebeck coefficient Sm in a length direction of the magneto-thermoelectric conversion body and a Seebeck coefficient Sc in a length direction of the wiring is 10 μV/K or less.

Advantageous Effects of Invention

The thermoelectric conversion element described above is advantageous from the viewpoint of improving the accuracy of heat sensing while utilizing magneto-thermoelectric conversion.

DESCRIPTION OF EMBODIMENTS

Hereinafter, embodiments of the present invention will be described with reference to the attached drawings. It should be noted that the present invention is not limited to the following embodiments.

Figure 1:
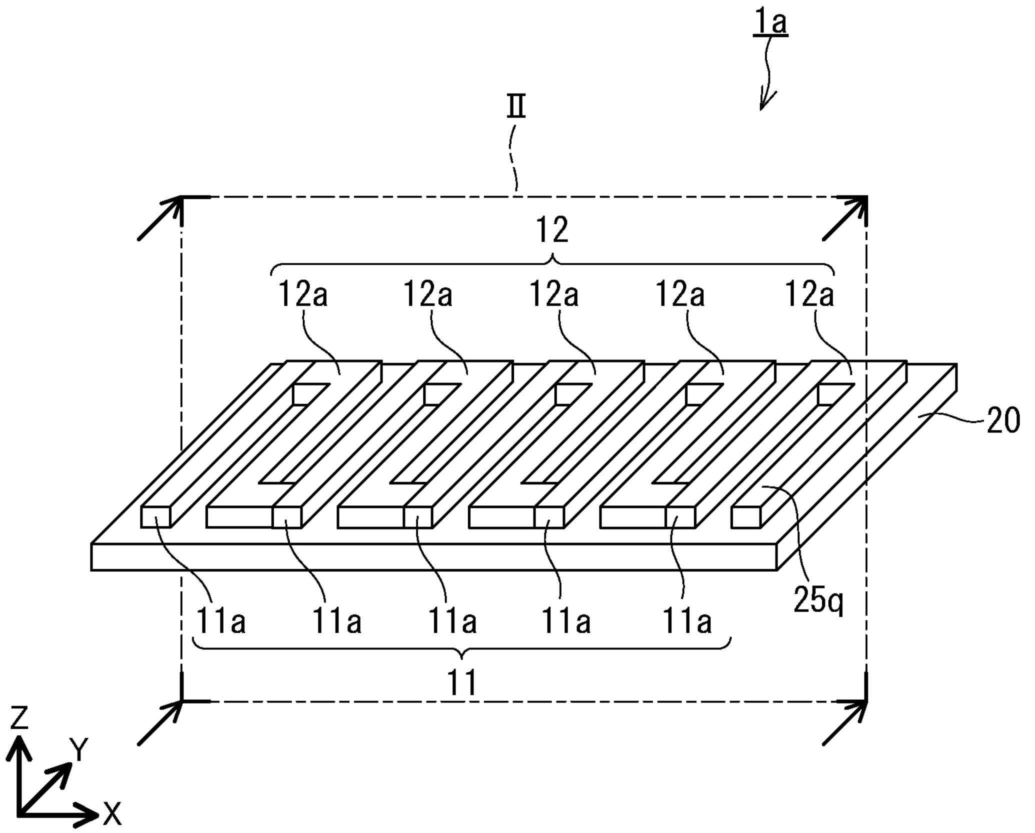
FIG. 1 is a perspective view showing an example of embodiment for a thermoelectric conversion element.

As shown in FIG. 1, a thermoelectric conversion element 1*a* includes a magneto-thermoelectric conversion body 11 and a wiring 12. The magneto-thermoelectric conversion body 11 extends linearly. The wiring 12 is electrically connected to the magneto-thermoelectric conversion body 11. In the thermoelectric conversion element 1*a*, an absolute value |ΔS| of a difference between a Seebeck coefficient Sm in a length direction of the magneto-thermoelectric conversion body 11 and a Seebeck coefficient Sc in a length direction of the wiring 12 is 10 μV/K or less. The Seebeck coefficient Sm and the Seebeck coefficient Sc are values at a temperature of 25 to 40° C., for instance, and the Seebeck coefficients can be measured according to the method described in Example. In the attached drawings, the X-axis, the Y-axis and the Z-axis are orthogonal to each other. The magneto-thermoelectric conversion body 11 and the wiring 12 are disposed along a surface parallel to the XY plane, for instance.

In the thermoelectric conversion element 1*a*, when a temperature gradient occurs in the length direction (Y-axis direction) of the magneto-thermoelectric conversion body 11, a thermal electromotive force due to the Seebeck effect may occur in the length direction due to the difference between the Seebeck coefficient Sm and the Seebeck coefficient Sc. However, for the thermoelectric conversion element 1*a*, since the absolute value |ΔS| is 10 μV/K or less, the thermal electromotive force due to the Seebeck effect that occurs in the length direction of the magneto-thermoelectric conversion body 11 tends to be smaller even if a temperature gradient occurs in the length direction. Therefore, in a sensing using the thermoelectric conversion element 1*a*, the electromotive force due to the Seebeck effect, which is superimposed on the electromotive force caused by the magneto-thermoelectric conversion, tends to be smaller. As a result, the thermoelectric conversion element 1*a* is advantageous from the viewpoint of realizing a highly accurate heat sensing by using magneto-thermoelectric conversion.

The absolute value |ΔS| may be 9.5 μV/K or less, may be 9.0 μV/K or less, may be 8.5 μV/K or less, may be 8.0 μV/K or less, may be 7.5 μV/K or less, or may be 7.0 pV/K or less. The absolute value |ΔS| may be 6.5 V/K or less, may be 6.0 μV/K or less, may be 5.5 μV/K or less, or may be 5.0 μV/K or less. The absolute value |ΔS| may be 4.5 μV/K or less, may be 4.0 μV/K or less, may be 3.5 μV/K or less, may be 3.0 μV/K or less, may be 2.5 μV/K or less, or may be 2.0 μV/K or less. The absolute value |ΔS| may be 1.5 μV/K or less, may be 1.0 μV/K or less, may be 0.8 μV/K or less, may be 0.5 pV/K or less, may be 0.3 μV/K or less, or may be 0.2 μV/K or less. The lower limit of the absolute value |ΔS| is not limited to a specific value. The absolute value |ΔS| is 0.01 μV/K or more for instance, and it may be 0.05 μV/K or more, may be 0.1 μV/K or more, may be 0.2 μV/K or more, may be 0.5 μV/K or more, or may be 1.0 V/K or more.

The relationship in terms of signs between the Seebeck coefficient Sm and the Seebeck coefficient Sc is not limited to a specific relationship as long as the absolute value |ΔS| is 10 μV/K or less. The Seebeck coefficient Sm and the Seebeck coefficient Sc represent values of the same sign, for instance. As a result, the absolute value |ΔS| tends to be smaller. Alternatively, the Seebeck coefficient Sm and the Seebeck coefficient Sc may represent values of different signs.

As long as the absolute value |ΔS| is 10 μV/K or less, the Seebeck coefficient Sc is not limited to a specific value. The Seebeck coefficient Sc has a value of 0 or less, for instance. The Seebeck coefficient Sc is 0 μV/K or less for instance, and it may be −5 μV/K or less, may be −10 μV/K or less, may be −15 μV/K or less, or may be −20 μV/K or less. The Seebeck coefficient Sc is −50 μV/K or more, for instance. The Seebeck coefficient Sc may be a positive value for instance, and it may be 1 μV/K or more, may be 3 pV/K or more, may be 5 μV/K or more, or may be 10 μV/K or more.

As long as the absolute value |ΔS| is 10 μV/K or less, the Seebeck coefficient Sm is not limited to a specific value. The Seebeck coefficient Sm is 0 μV/K for instance, and it may be −5 μV/K or less, may be −10 μV/K or less, may be −15 μV/K or less. The Seebeck coefficient Sm is-50 μV/K or more, for instance. The Seebeck coefficient Sm may be a positive value, for instance, it may be 1 μV/K or more, may be 3 μV/K or more, may be 5 μV/K or more, or may be 10 μV/K or more.

The absolute value |Sm| of the Seebeck coefficient Sm is desirably 10 μV or more. In this case, the magneto-thermoelectric coefficient tends to increase, and the thermoelectric conversion performance of thermoelectric conversion element 1*a* can easily be improved. The absolute value |Sm| may be 15 μV or more, or may be 20 μV or more.

As long as the absolute value |ΔS| is 10 μV/K or less, the specific resistance of the wiring 12 is not limited to a specific value. The wiring 12 has a specific resistance in a range of 8 to 200 μΩ·cm, for instance. This may facilitate adjustment of the Seebeck coefficient Sc into a desired range. Furthermore, the resistance can be lowered easily even if wiring 12 is made thinner.

The specific resistance of the wiring 12 may be 10 μΩ·cm or more, may be 15μΩ cm or more, may be 20 μΩ·cm or more, may be 25μΩ·cm or more, or may be 30μΩ·cm or more. The specific resistance of the wiring 12 may be 180 μΩ·cm or less, may be 150 μΩ·cm or less, may be 140μΩ·cm or less, may be 130μΩ·cm or less, may be 120μΩ·cm or less, may be 110μΩ ·cm or less, or may be 100μΩ·cm or less.

As long as the absolute value |ΔS| is 10 μV/K or less, the material for constituting the wiring 12 is not limited to a specific material. For instance, the wiring 12 includes at least one metal selected from the group consisting of Cu, Ag, Au, Al, Ni, and Co. In this case, the content of these metals in the wiring 12 is 50% or more based on the number of atoms. In other words, the content of Cu, Ag, Au, Al, Ni, and Co in the wiring 12 is 50% or more in total based on the number of atoms. This may facilitate adjustment of the Seebeck coefficient Sc to a desired value, whereby the specific resistance of the wiring 12 can be lowered easily.

The wiring 12 may be formed of a single-component metal or an alloy.

The wiring 12 may include at least one metal selected from the group consisting of Cu, Ag, Au and Al, and at least one element selected from the group consisting of a Group 8 element, a Group 9 element, and a Group 10 element. In this case, the Seebeck coefficient Sc of the alloy tends to vary over a wide range from positive to negative values depending on the composition, which may make it easy to adjust the Seebeck coefficient Sc to a desired value. The Group 8 element is Fe, for instance. The Group 9 element is Co, for instance. The Group 10 element is Ni or Pt, for instance. The content of at least one element in the wiring 12 selected from the group consisting of the Group 8 element, the Group 9 element, and the Group 10 element is not limited to a specific value. The content may be 1% or more, may be 3% or more, may be 5% or more, may be 10% or more, may be 20% or more, may be 30% or more, may be 40% or more, or may be 50% or more based on the number of atoms.

As long as the absolute value |ΔS| is 10 μV/K or less, the magneto-thermoelectric conversion body 11 is not limited to a specific material. The magneto-thermoelectric conversion body 11 generates an electromotive force by means of the magneto-thermoelectric effect. The magneto-thermoelectric effect is, for instance, an anomalous Nernst effect or a spin Seebeck effect.

The magneto-thermoelectric conversion body 11 includes, for instance, a substance expressing the anomalous Nernst effect. A substance that expresses the anomalous Nernst effect is not limited to a specific substance. The substance expressing the anomalous Nernst effect is, for instance, a magnetic body having a saturation magnetic susceptibility of $5\times10^{-3}$ T or more, or a substance of a band structure with a Weyl point near the Fermi energy. For instance, the magneto-thermoelectric conversion body 11 contains as a substance expressing the anomalous Nernst effect, at least one substance selected from the group consisting of (i), (ii), (iii), (iv) and (v) below.

(i) A stoichiometric substance having a composition represented by $Fe_3X$ (ii) An off-stoichiometric substance having a composition ratio of Fe and X that deviates from that of the substance in (i) above (iii) A substance in which a part of the Fe site of the substance in (i) above or a part of the Fe site in the substance in (ii) above is substituted by a typical metal element or a transition element other than X (iv) A substance having a composition represented by $Fe_3M1_{1-x}M2_x$ (0<x<1), where M1 and M2 are typical elements different from each other (v) A substance in which a part of the Fe site of the substance in (i) above is substituted by a transition element other than X, and a part of the X site in the substance in (i) above is substituted by a typical metal element other than X In the substances (i) to (v), X is a typical element or a transition element. X is, for instance, Al, Ga, Ge, Sn, Si, Ti, Zr, Hf, V, Nb, Ta, Cr, Mo, W, Sc, Ni, Mn, or Co. In the above (iv), the combination of M1 and M2 is not limited to a specific combination as long as M1 and M2 are typical elements different from each other. In the above (iv), the combination of M1 and M2 is, for instance, Ga and Al, Si and Al, or Ga and B.

The magneto-thermoelectric conversion body 11 may contain $Co_2MnGa$ as a substance expressing the anomalous Nernst effect, or it may contain $Mn_3Sn$ that is an antiferromagnetic body.

The magneto-thermoelectric conversion body 11 may be an alloy having a body-centered cubic lattice crystal structure, and the alloy contains Fe. In this case, a large electromotive force is likely to occur in the magneto-thermoelectric conversion body 11 due to the anomalous Nernst effect.

In a case where the magneto-thermoelectric conversion body 11 is an alloy having a body-centered cubic lattice crystal structure and the alloy contains Fe, the content of Fe and the content of the element other than Fe in the alloy are not limited to specific values. The content of Fe in the alloy is 50% or more based on the number of atoms for instance, and the content of the element other than Fe in the alloy is 10% or more based on the number of atoms, for instance. In this case, a large electromotive force is likely to be generated in the magneto-thermoelectric conversion body 11 due to the anomalous Nernst effect.

The content of Fe in the alloy may be 55% or more, may be 60% or more, may be 65% or more, or may be 70% or more based on the number of atoms. The content of Fe in the alloy may be 90% or less, may be 85% or less, or may be 80% or less based on the number of atoms.

The content of the element other than Fe may be 15% or more, or may be 20% or more based on the number of atoms. The content of the element other than Fe may be 50% or less, may be 40% or less, or may be 30% or less based on the number of atoms.

The magneto-thermoelectric coefficient $S_{NE}$ of the magneto-thermoelectric conversion body 11 is not limited to a specific value. The absolute value of magneto-thermoelectric coefficient $S_{NE}$ of the magneto-thermoelectric conversion body 11 is 0.5 μV/K or more, for instance. As a result, a large electromotive force may be generated easily due to the magneto-thermoelectric conversion in the magneto-thermoelectric conversion body 11, and the accuracy in sensing by means of the thermoelectric conversion element 1*a* can be easily improved. This may facilitate delicate heat sensing. The absolute value of the magneto-thermoelectric coefficient $S_{NE}$ of the magneto-thermoelectric conversion body 11 is desirably 1.0 μV/K or more, more desirably 1.5 μV/K or more, and even more desirably 2.0 μV/K or more. The absolute value of the magneto-thermoelectric coefficient $S_{NE}$ of the magneto-thermoelectric conversion body 11 may be 3.0 μV/K or more, may be 4.0 μV/K or more, may be 5.0 μV/K or more, may be 6.0 μV/K or more, may be 7.0 μV/K or more, or may be 8.0 μV/K or more.

Figure 2:
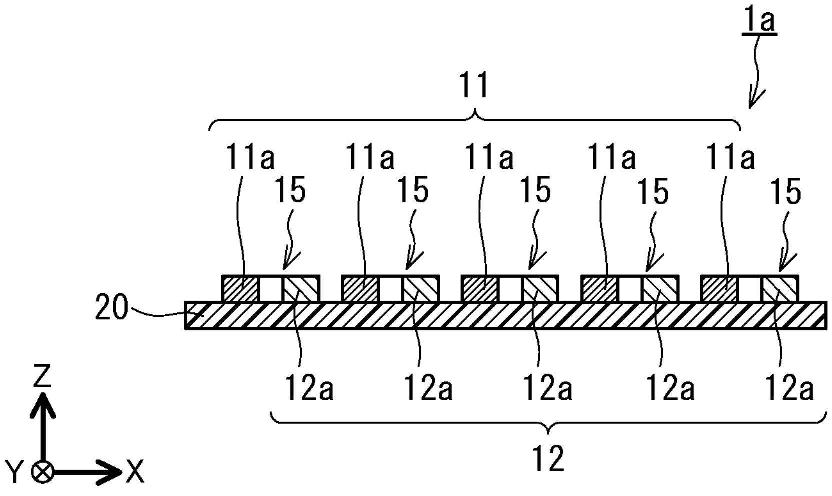
FIG. 2 is a cross-sectional view of the thermoelectric conversion element in FIG. 1, taken on a plane II as the cross section.

As shown in FIGS. 1 and 2, the magneto-thermoelectric conversion body 11 includes a plurality of first thin wires

11*a*, for instance. And the wiring 12 includes a plurality of second thin wires 12*a*. In the thermoelectric conversion element 1*a*, the first thin wires 11*a* and the second thin wires 12*a* are electrically connected to each other in series. With this configuration, the electromotive force caused by the magneto-thermoelectric conversion occurring in the first thin wires 11*a* is synthesized, making it easy to obtain a large output from the thermoelectric conversion element 1*a*.

In the thermoelectric conversion element 1*a*, the first thin wires 11*a* and the second thin wires 12*a* make a plurality of thin wire pairs 15, for instance. Each thin wire pair 15 consists of a first thin wire 11*a* and a second thin wire 12*a*. In other words, each thin wire pair 15 consists of one first thin wire 11*a* and one second thin wire 12*a*. The number of thin wire pairs 15 in the thermoelectric conversion element 1*a* is not limited to a specific value. In the thermoelectric conversion element 1*a*, the first thin wires 11*a* and the second thin wires 12*a* form at least fifty thin wire pairs 15, for instance. The electromotive force due to the Seebeck effect increases as the number of pairs of dissimilar materials joined increases. Meanwhile, as for the thermoelectric conversion element 1*a*, the absolute value $|\Delta S|$ is 10 μV/K or less. Therefore, even if the thermoelectric conversion element 1*a* has fifty or more pairs of the thin wires, the thermal electromotive force tends to be smaller. Here, the thermal electromotive force due to the Seebeck effect occurs in the length direction of the magneto-thermoelectric conversion body 11 in a case where a temperature gradient occurs in the length direction.

As shown in FIGS. 1 and 2, the first thin wires 11*a* and the second thin wires 12*a* form a meander pattern. According to this configuration, even if the area of the plane on which the first thin wires 11*a* and the second thin wires 12*a* are disposed is small, a large output can be obtained easily from the thermoelectric conversion element 1*a*.

As shown in FIG. 1, the first thin wires 11*a* are disposed spaced apart from each other at predetermined intervals in the X-axis direction and parallel to each other, for instance. The first thin wires 11*a* are disposed at equal intervals in the X-axis direction. The second thin wires 12*a* electrically connect, for instance, the first thin wires 11*a* adjacent to each other in the X-axis direction. A second thin wire 12*a* electrically connects, for instance, a first end part of a first thin wire 11*a* in the Y-axis direction and a second end part of another first thin wire 11*a* adjacent to the first-described first thin wire 11*a* in the Y-axis direction. The first end parts in the Y-axis direction of the first thin wires 11*a* are positioned at the end on the same side of the first thin wires 11*a* in the Y-axis direction, while the second end parts in the Y-axis direction of the first thin wires 11*a* are positioned at the end opposite to the first end parts in the Y-axis direction of the first thin wires 11*a*.

The thickness of the first thin wires 11*a* is not limited to a specific value. The first thin wires 11*a* have a thickness of 1000 nm or less, for instance. Thereby, use amount of the material for the magneto-thermoelectric conversion body in the thermoelectric conversion element 1*a* can be decreased, and the cost for manufacturing the thermoelectric conversion element 1*a* can be reduced easily. In addition to that, disconnection of a conductive path formed with the first thin wires 11*a* and the second thin wires 12*a* in the thermoelectric conversion element 1*a* is unlikely to occur.

The thickness of the first thin wires 11*a* may be 750 nm or less, may be 500 nm or less, may be 400 nm or less, may be 300 nm or less, or may be 200 nm or less. The thickness of the first thin wires 11*a* is 5 nm or more, for instance. Thereby, the thermoelectric conversion element 1*a* can easily exhibit high durability. The thickness of the first thin wires 11*a* may be 10 nm or more, may be 20 nm or more, may be 30 nm or more, or may be 50 nm or more.

The width of first thin wires 11*a*, which is the dimension in the X-axis direction, is not limited to a specific value. The width of the first thin wires 11*a* is 500 μm or less, for instance. Thereby, use amount of the material for the magneto-thermoelectric conversion body in the thermoelectric conversion element 1*a* can be decreased, and the cost for manufacturing the thermoelectric conversion element 1*a* can be easily reduced. In addition to that, numbers of the first thin wires 11*a* can be easily disposed in the X-axis direction, so that the electromotive force generated in accordance with the magneto-thermoelectric conversion in thermoelectric conversion element 1*a* tends to be increased.

The width of the first thin wires 11*a* may be 400 μm or less, may be 300 μm or less, may be 200 μm or less, may be 100 μm or less, or may be 50 μm or less. The width of the first thin wires 11*a* is 0.1 μm or more, for instance. Thereby, disconnection of a conductive path is unlikely to occur, and the thermoelectric conversion element 1*a* can easily exhibit high durability. The width of the first thin wires 11*a* may be 0.5 μm or more, may be 1 μm or more, may be 2 μm or more, may be 5 μm or more, may be 10 μm or more, may be 20 μm or more, or may be 30 μm or more.

The thickness of the second thin wires 12*a* is not limited to a specific value. The thickness of the second thin wires 12*a* is 1000 nm, for instance. Thereby, use amount of the material for the wiring 12 can be decreased, and the cost for manufacturing the thermoelectric conversion element 1*a* can be reduced easily. In addition to that, disconnection of a conductive path in the thermoelectric conversion element 1*a* is unlikely to occur. The thickness of the second thin wires 12*a* may be 750 nm or less, may be 500 nm or less, may be 400 nm or less, may be 300 nm or less, may be 200 nm or less, or may be 100 nm or less.

The thickness of the second thin wires 12*a* is 5 nm or more, for instance. Thereby, the thermoelectric conversion element 1*a* can easily exhibit high durability. The thickness of the second thin wires 12*a* may be 10 nm or more, may be 20 nm or more, may be 30 nm or more, or may be 50 nm or more.

The width of the second thin wires 12*a*, which is the minimum dimension in the X-axis direction, is not limited to a specific value. The width of the second thin wires 12*a* is 500 μm or less, for instance. Thereby, use amount of the material for the wiring 12 in the thermoelectric conversion element 1*a* can be decreased, and the cost for manufacturing the thermoelectric conversion element 1*a* can be easily reduced. In addition to that, numbers of the second wirings 12*a* can be easily disposed in the X-axis direction, so that the electromotive force generated due to the magneto-thermoelectric conversion in the thermoelectric conversion element 1*a* tends to be increased.

The width of the second thin wires 12*a* may be 400 μm or less, may be 300 μm or less, may be 200 μm or less, may be 100 μm or less, or may be 50 μm or less. The width of the second thin wires 12*a* is 0.1 μm or more, for instance. Thereby, disconnection of the conductive path in the thermoelectric conversion element 1*a* is unlikely to occur, and the thermoelectric conversion element 1*a* can easily exhibit high durability. The width of the second thin wires 12*a* may be 0.5 μm or more, may be 1 μm or more, may be 2 μm or more, may be 5 μm or more, may be 10 μm or more, may be 20 μm or more, or may be 30 μm or more.

As shown in FIG. 1, the thermoelectric conversion element 1*a* includes further a substrate 20. The magneto-thermoelectric conversion body 11 and the wiring 12 are disposed on the substrate 20.

A material for forming the substrate 20 is not limited to a specific one. The substrate 20 does not contain MgO for instance, in its surface layer. Since the substrate 20 is not required to contain MgO in its surface layer, production of the thermoelectric conversion element 1*a* is less complicated, and acid resistance is also easily imparted.

The substrate 20 has flexibility, for instance, so that an object to which the thermoelectric conversion element 1*a* is attached can be shaped with less limitation. In a case where the substrate 20 has flexibility, the substrate 20 may include at least an organic polymer, for instance. This may make it possible to reduce the cost for manufacturing the thermoelectric conversion element 1*a*. Examples of the organic polymer include polyethylene terephthalate (PET), polyethylene naphthalate (PEN), acrylic resin (PMMA), polycarbonate (PC), polyimide (PI), or cycloolefin polymer (COP). The substrate 20 may be an ultrathin glass sheet. An example of ultrathin glass sheet is G-Leaf (registered trademark) manufactured by Nippon Electric Glass Co., Ltd.

An example of the method for manufacturing the thermoelectric conversion element 1*a* will be explained. First, on one of the principal surfaces of the substrate 20, a thin film of a precursor of the magneto-thermoelectric conversion body 11 is formed by any method such as sputtering, chemical vapor deposition (CVD), pulsed laser deposition (PLD), ion plating, or plating. Next, a photoresist is applied onto the thin film, a photomask is disposed above the thin film and exposed, followed by wet etching. As a result, a plurality of linear patterns of the precursor of the magneto-thermoelectric conversion body 11 disposed at predetermined intervals are formed. Next, on one of the principal surfaces of the substrate 20, a thin film of precursor for the wiring 12 is formed by any method such as sputtering, CVD, PLD, ion plating, or plating. Next, a photoresist is applied onto the thin film of precursor of the wiring 12, a photomask is disposed above the thin film of precursor of the wiring 12 and exposed, followed by wet etching. In this manner, the wiring 12 is obtained, and the linear patterns of the precursor of the magneto-thermoelectric conversion body 11 are electrically connected to each other. Next, the precursor of the magneto-thermoelectric conversion body 11 is magnetized to form the magneto-thermoelectric conversion body 11. A thermoelectric conversion element 1*a* is obtained in this way. The precursor of the wiring 12 may be magnetized to form the wiring 12, as required.

The thermoelectric conversion element 1*a* can be provided with a pressure-sensitive adhesive layer, for instance. In this case, the substrate 20 is disposed between the thermoelectric conversion body 11 and the pressure-sensitive adhesive layer in the thickness direction of the substrate 20. Thereby, it is possible to attach the thermoelectric conversion element 1*a* to an article by pressing the pressure-sensitive adhesive layer onto the article.

The pressure-sensitive adhesive layer includes, for instance, a rubber-based pressure-sensitive adhesive, an acrylic pressure-sensitive adhesive, a silicone-based pressure-sensitive adhesive, or a urethane-based pressure-sensitive adhesive. The thermoelectric conversion element 1*a* may be provided together with a pressure-sensitive adhesive layer and a release liner. In this case, the release liner covers the pressure-sensitive adhesive layer. Typically, the release liner is a film that can maintain the adhesiveness of the pressure-sensitive adhesive layer while covering the layer, and it can be peeled off easily from the pressure-sensitive adhesive layer. The release liner is, for instance, a film made of a polyester resin like PET. By peeling the release liner off, the pressure-sensitive adhesive layer is exposed and the thermoelectric conversion element 1*a* can be adhered to an article.

A sensor equipped with the thermoelectric conversion element 1*a* can be provided. In this sensor, for instance, when a temperature gradient occurs in the thickness direction of the substrate 20, an electromotive force is generated by the magneto-thermoelectric effect in the length direction of the magneto-thermoelectric conversion body 11. The sensor is capable of sensing heat by processing electric signals output from the thermoelectric conversion element 1*a*, based on the electromotive force.

Figure 3:
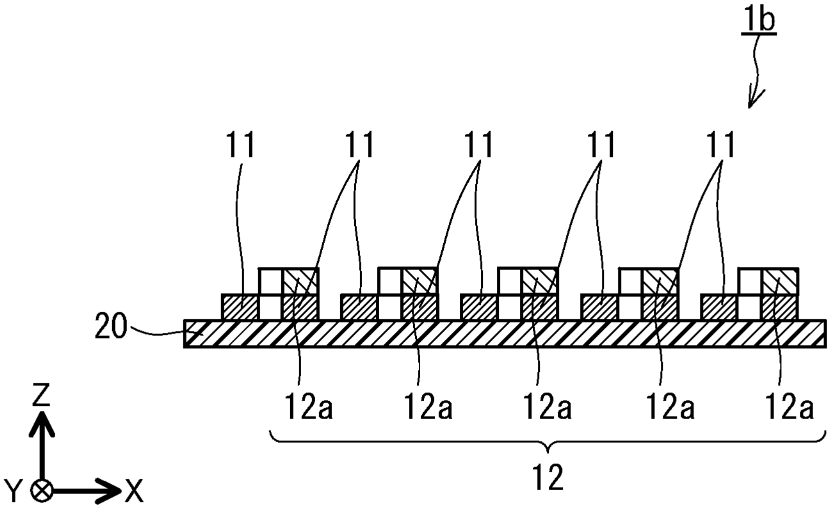
FIG. 3 is a cross-sectional view showing another example of thermoelectric conversion element.
Figure 4:
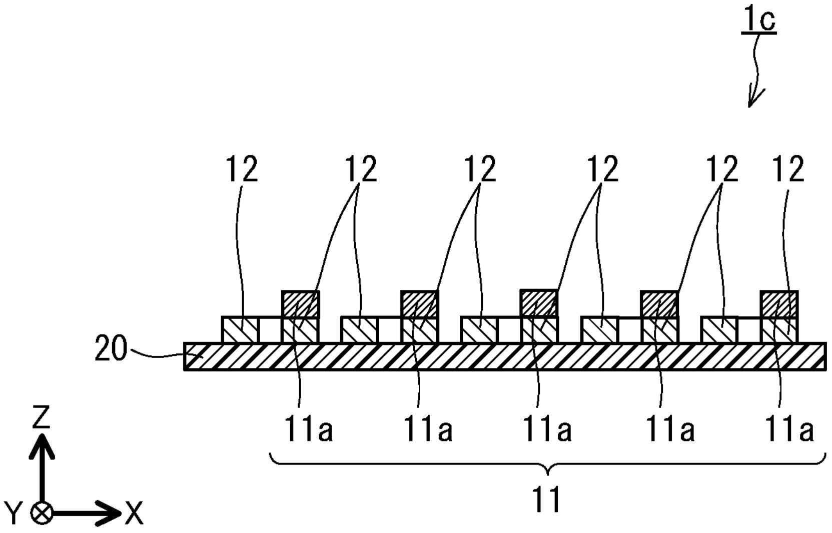
FIG. 4 is a cross-sectional view showing still another example of thermoelectric conversion element.

The thermoelectric conversion element 1*a* can be modified from various viewpoints. For instance, the thermoelectric conversion element 1*a* may be modified to a thermoelectric conversion element 1*b* as shown in FIG. 3 or a thermoelectric conversion element 1*c* as shown in FIG. 4. The thermoelectric conversion element 1*b* and the thermoelectric conversion element 1*c* have the same structure as the thermoelectric conversion element 1*a*, except for the parts that are specifically explained. Components that are the same as or correspond to those of the thermoelectric conversion element 1*a* are given the same reference numerals, and detailed explanations therefor are omitted. The explanations regarding the thermoelectric conversion element 1*a* also apply to the thermoelectric conversion element 1*b* and the thermoelectric conversion element 1*c*, unless technically contradictory.

As shown in FIG. 3, in the thermoelectric conversion element 1*b*, the magneto-thermoelectric conversion body 11 extends continuously on the same plane, for instance. The wiring 12 is disposed on a part of the magneto-thermoelectric conversion body 11. For instance, the second thin wires 12*a* are disposed spaced apart from each other at predetermined intervals on the magneto-thermoelectric conversion body 11. With such a configuration, the thermal electromotive force due to the Seebeck effect tends to be small, and furthermore, the manufacturing costs can be easily reduced.

In the thermoelectric conversion element 1*b*, the magneto-thermoelectric conversion body 11 forms a meander pattern, for instance. The thermoelectric conversion element 1*b* is configured such that a single layer of the magneto-thermoelectric conversion body 11 and a layered body including the magneto-thermoelectric conversion body 11 and the second thin wire 12*a* appear alternately in the X-axis direction.

As shown in FIG. 4, in the thermoelectric conversion element 1*c*, the wiring 12 extends continuously on the same plane, for instance. The magneto-thermoelectric conversion body 11 is disposed on a part of the wiring 12. For instance, a plurality of first thin wires 11*a* are disposed spaced apart from each other at predetermined intervals on the wiring 12. With this configuration, the thermal electromotive force due to the Seebeck effect tends to be small, and the manufacturing cost can be decreased easily.

In the thermoelectric conversion element 1*c*, the wiring 12 forms a meander pattern, for instance. The thermoelectric conversion element 1*c* is configured such that a single layer of the wiring 12 and a layered body including the wiring 12 and the first thin wires 11*a* appear alternately in the X-axis direction.

EXAMPLES

Hereinafter, the present invention will be described in detail by referring to Examples. It should be noted that the present invention is not limited to the following Examples. First, evaluation methods regarding Examples and Comparative Examples will be explained.

[Measurement of Seebeck Coefficient]

Using a small-sized refrigerant-free physical property measurement system PPMS VersaLab manufactured by Quantum Design, a Seebeck coefficient Sm and a Seebeck coefficient Sc in a thermoelectric conversion element according to each Example and each Comparative Example were measured, and the absolute value |ΔS| of the difference between them was determined. The Seebeck coefficient Sm is a Seebeck coefficient at 27 to 37° C. in the length direction of the thin wire for magneto-thermoelectric conversion, and the Seebeck coefficient Sc is a Seebeck coefficient at 27 to 37° C. in the length direction of the wiring. The results are shown in Table 1. The Seebeck coefficient Sm and the Seebeck coefficient Sc were determined based on the electromotive force and a temperature difference induced between two thermometers attached to a sample when a heat flow was generated by a heater attached to one end of the sample.

[Measurement of Magneto-Thermoelectric Coefficient]

The magneto-thermoelectric coefficient (Nernst coefficient) at 27 to 37° C. of the thin wires for magneto-thermoelectric conversion in the thermoelectric conversion element of each Example and each Comparative Example was measured using Quantum Design's small-sized refrigerant-free physical property measurement system PPMS VersaLab. The results are shown in Table 1.

[Measurement of Thermal Electromotive Force of Thermoelectric Conversion Element]

The thermoelectric conversion element according to each Example and each Comparative Example was fixed between a pair of Cu plates with dimensions of 30 mm, 30 mm, and 5 mm, using silicone grease KS609 manufactured by Shin-Etsu Chemical Co., Ltd., thereby producing a sample for thermoelectric property evaluation. This sample was placed on a cool plate SCP-125 supplied by AS ONE Corporation. A film heater manufactured by Shinwa Rules Co., Ltd. was fixed on the upper Cu plate with a double-sided tape No. 5000NS manufactured by Nitto Denko Corporation. This heater had dimensions of 30 mm square and an electrical resistance value of 20Ω. While the temperature of the cool plate was maintained at 25° C., the film heater was made generate heat under a constant voltage control of 10 V, and the amount of heat output from the film heater was adjusted to 0.52 W/cm$^2$. At this time, the electromotive force $V_N$ generated in the thermoelectric conversion element was measured using a digital multimeter so as to read the value of electromotive force in a steady state. The results are shown in Table 1.

[Measurement of Specific Resistance]

Sheet resistance of the thin film for wiring was measured in each Example and each Comparative Example by the eddy current measurement method using a non-contact type resistance measuring instrument NC-80MAP manufactured by NAPSON CORPORATION in accordance with Japanese Industrial Standard (JIS) Z 2316. The specific resistance of the wiring was determined by calculating the product of the sheet resistance of the thin film for the wiring measured in this way and the thickness of the wiring. The results are shown in Table 1.

[Measurement of Electromotive Force Due to Seebeck Effect]

In the plane of a thermoelectric conversion element according to each Example and each Comparative Example, one end in the length direction of the thin wire for thermoelectric conversion and one end in the length direction of the wiring were heated with a heater to cause a temperature difference of 1° C. between the both ends of the thermoelectric conversion thin wire and the both ends of the wiring. In this state, the electromotive force Vs due to the Seebeck effect was measured. During the measurement, temperatures on both surfaces of the thermoelectric conversion element were kept constant in order to prevent a temperature gradient in the thickness direction of the thermoelectric conversion element except for one end in the length direction of the thin wire for thermoelectric conversion and wiring. The results are shown in Table 1.

Example 1

A thin film having a thickness of 100 nm was formed on a polyethylene terephthalate (PET) film having a thickness of 50 μm by DC magnetron sputtering, using a target material containing Fe and Ga. In this target material, the atomic ratio of the Fe content to the Ga content was in a relationship of 3:1. A photoresist was applied onto the thin film, a photomask was disposed above the thin film and exposed, followed by wet etching. Thereby, 94 thin wires for magneto-thermoelectric conversion aligned at predetermined intervals were formed. The width of each thin wire for magneto-thermoelectric conversion was 100 μm, and the length of each thin wire for magneto-thermoelectric conversion was 15 mm. After that, a CuNi thin film having a thickness of 100 nm was formed by DC magnetron sputtering using a target material containing Cu and Ni. In this target material, the atomic ratio of the Cu content to the Ni content was in a relationship of 95:5. A photoresist was applied onto the CuNi thin film, a photomask was disposed above the CuNi thin film and exposed, followed by wet etching. Thereby, a wiring with a width of 40 μm was formed. A plurality of thin wires for magneto-thermoelectric conversion were electrically connected to each other in series by the wiring. Further, the thin wires for magneto-thermoelectric conversion and the wiring formed a meander pattern. The thin wires for magneto-thermoelectric conversion were magnetized in a direction parallel to the plane of the PET film and orthogonal to the length direction of the thin wires for magneto-thermoelectric conversion, whereby a thermoelectric conversion element according to Example 1 was obtained. This thermoelectric conversion element generated an electromotive force based on the anomalous Nernst effect.

Example 2

A thermoelectric conversion element according to Example 2 was manufactured in the same manner as in Example 1 except that a wiring was formed using a target material having an atomic ratio of Cu content:Ni content=93:7.

Example 3

A thermoelectric conversion element according to Example 3 was manufactured in the same manner as in Example 1 except that a wiring was formed using a target material having an atomic ratio of Cu content:Ni content=87:13.

Example 4

A thermoelectric conversion element according to Example 4 was manufactured in the same manner as in Example 1 except that a wiring was formed using a target material having an atomic ratio of Cu content:Ni content=79:21.

Example 5

A thermoelectric conversion element according to Example 5 was manufactured in the same manner as in Example 1 except that a wiring was formed using Ni as the target material.

Example 6

A thermoelectric conversion element according to Example 6 was manufactured in the same manner as in Example 1 except that a wiring was formed using a target material having an atomic ratio of Cu content:Co content=77:23.

Example 7

A thermoelectric conversion element according to Example 7 was manufactured in the same manner as in Example 1 except that a wiring was formed using a target material having an atomic ratio of Cu content:Fe content=41:59.

Example 8

A thermoelectric conversion element according to Example 8 was manufactured in the same manner as in Example 1 except that a wiring was formed using a target material having an atomic ratio of Cu content:Ni content=88:12.

Example 9

A thermoelectric conversion element according to Example 9 was manufactured in the same manner as in Example 1 except that a wiring was formed using a target material having an atomic ratio of Cu content:Co content=68:32.

Example 10

A thermoelectric conversion element according to Example 10 was manufactured in the same manner as in Example 1 except that a wiring was formed using a target material having an atomic ratio of Cu content:Co content=63:37.

Example 11

A thermoelectric conversion element according to Example 11 was manufactured in the same manner as in Example 1 except that a wiring was formed using a target material having an atomic ratio of Cu content:Co content=22:78.

Example 12

A thermoelectric conversion element according to Example 12 was manufactured in the same manner as in Example 1 except that a wiring was formed using a $Co_2MnGa$ target instead of a target material containing Fe and Ga, and using a target material having an atomic ratio of Cu content:Ni content=79:21.

Example 13

A thermoelectric conversion element according to Example 13 was manufactured in the same manner as in Example 1 except that a wiring was formed using an $Mn_3Sn$ target instead of a target material containing Fe and Ga, and using a target material having an atomic ratio of Cu content:Ag content=50:50.

Comparative Example 1

A thermoelectric conversion element according to Comparative Example 1 was manufactured in the same manner as in Example 1 except that a wiring was formed using Cu as a target material.

Comparative Example 2

A thermoelectric conversion element according to Comparative Example 2 was manufactured in the same manner as in Example 1 except that thin wires for thermoelectric conversion were formed using a target material containing Fe and Pt, and a wiring was formed using Cr as a target material. This thermoelectric conversion element generated an electromotive force based on the anomalous Nernst effect.

Comparative Example 3

A thermoelectric conversion element according to Comparative Example 3 was manufactured in the same manner as in Example 1 except that a wiring was formed using Au as a target material.

Comparative Example 4

A thermoelectric conversion element according to Comparative Example 4 was manufactured in the same manner as in Example 1 except that a wiring was formed using a $Co_2MnGa$ target instead of a target material containing Fe and Ga, and using Au as a target material.

The Seebeck electromotive force Vs in the thermoelectric conversion element according to each Example was lower than the Seebeck electromotive force Vs in the thermoelectric conversion element according to each Comparative Example. The Seebeck electromotive force Vs can be reduced since the absolute value of the difference between the Seebeck coefficient Sm in the length direction of the thin wires for magneto-thermoelectric conversion and the Seebeck coefficient Sc in the length direction of the wiring is 10 ρV/K or less. This is understood to be advantageous from the viewpoint of improving the accuracy of measuring the temperature difference in the thickness direction of the thermoelectric conversion element.

A first aspect of the present invention provides a thermoelectric conversion element including:

a magneto-thermoelectric conversion body extending linearly; and a wiring electrically connected to the magneto-thermoelectric conversion body, wherein an absolute value of a difference between a Seebeck coefficient Sm in a length direction of the magneto-thermoelectric conversion body and a Seebeck coefficient Sc in a length direction of the wiring is 10 μV/K or less.

A second aspect of the present invention provides the thermoelectric conversion element according to the first aspect, wherein an absolute value of the Seebeck coefficient Sm is 10 μV/K or more.

A third aspect of the present invention provides the thermoelectric conversion element according to the first or second aspect, wherein the Seebeck coefficient Sm and the Seebeck coefficient Sc represent values of the same sign.

A fourth aspect of the present invention provides the thermoelectric conversion element according to any one of the first to third aspects, wherein the Seebeck coefficient Sc has a value of 0 or less.

A fifth aspect of the present invention provides the thermoelectric conversion element according to any one of the first to fourth aspects, wherein the wiring has a specific resistance in a range of 8 to 200 μΩ·cm.

A sixth aspect of the present invention provides the thermoelectric conversion element according to any one of the first to fifth aspects, wherein the wiring includes at least one metal selected from the group consisting of Cu, Ag, Au, Al, Ni, and Co, and a content of the metal in the wiring is 50% or more based on the number of atoms.

A seventh aspect of the present invention provides the thermoelectric conversion element according to any one of the first to sixth aspects, wherein the wiring includes at least one metal selected from the group consisting of Cu, Ag, Au, and Al, and at least one element selected from the group consisting of a Group 8 element, a Group 9 element, and a Group 10 element.

An eighth aspect of the present invention provides the thermoelectric conversion element according to any one of the first to seventh aspects, wherein the magneto-thermoelectric conversion body is an alloy having a body-centered cubic lattice crystal structure, the alloy containing Fe.

A ninth aspect of the present invention provides the thermoelectric conversion element according to the eighth aspect, wherein a content of Fe in the alloy is 50% or more based on the number of atoms, and a content of the element other than Fe in the alloy is 10% or more based on the number of atoms.

A tenth aspect of the present invention provides the thermoelectric conversion element according to any one of the first to ninth aspects, wherein the magneto-thermoelectric conversion body has a plurality of first thin wires, the wiring has a plurality of second thin wires, and the first thin wires and the second thin wires are electrically connected to each other in series.

An eleventh aspect of the present invention provides the thermoelectric conversion element according to the tenth aspect, wherein the first thin wires and the second thin wires form fifty or more thin wire pairs, and each of the fifty or more thin wire pairs consists of the first thin wire and the second thin wire.

A twelfth aspect of the present invention provides the thermoelectric conversion element according to the tenth or eleventh aspect, wherein the first thin wires and the second thin wires form a meander pattern.

A thirteenth aspect of the present invention provides a sensor including the thermoelectric conversion element according to any one of the first to twelfth aspects.

TABLE 1

| | Thin wires for thermoelectric conversion | | | | | |
|---|---|---|---|---|---|---|
| | | | Magneto- | Wiring | | |
| | Material | Seebeck coefficient Sm [μV/K] | thermoelectric coefficient $S_{NE}$ [μV/K] | Material | Specific resistance [μΩ · cm] | Seebeck coefficient Sc [μV/K] |
| Example 1 | $Fe_3Ga$ | −19 | 2.0 | $CU_{95}Ni_5$ | 8.2 | −11.0 |
| Example 2 | $Fe_3Ga$ | −19 | 2.0 | $Cu_{93}Ni_7$ | 11.0 | −14.0 |
| Example 3 | $Fe_3Ga$ | −19 | 2.0 | $CU_{87}Ni_{13}$ | 20.0 | −19.0 |
| Example 4 | $Fe_3Ga$ | −19 | 2.0 | $Cu_{79}Ni_{21}$ | 33.0 | −24.0 |
| Example 5 | $Fe_3Ga$ | −19 | 2.0 | Ni | 18.0 | −15.0 |
| Example 6 | $Fe_3Ga$ | −19 | 2.0 | $Cu_{77}Co_{23}$ | 51.0 | −16.0 |
| Example 7 | $Fe_3Ga$ | −19 | 2.0 | $Cu_{41}Fe_{59}$ | 96.0 | −18.0 |
| Example 8 | $Fe_3Ga$ | −19 | 2.0 | $Cu_{88}Ni_{12}$ | 18.3 | −18.7 |
| Example 9 | $Fe_3Ga$ | −19 | 2.0 | $CU_{68}Co_{32}$ | 33.4 | −18.2 |
| Example 10 | $Fe_3Ga$ | −19 | 2.0 | $Cu_{63}Co_{37}$ | 32.6 | −19.0 |
| Example 11 | $Fe_3Ga$ | −19 | 2.0 | $Cu_{22}Co_{78}$ | 29.7 | −19.1 |
| Example 12 | $Co_2MnGa$ | −25 | 3.8 | $Cu_{79}Ni_{21}$ | 33.0 | −24.0 |
| Example 13 | $Mn_3Sn$ | 10 | 0.5 | $Cu_{50}Ag_{50}$ | 7.9 | 4.5 |
| Comparative Example 1 | $Fe_3Ga$ | −19 | 2.0 | Cu | 6.5 | 2.0 |
| Comparative Example 2 | FePt | −12 | 0.6 | Cr | 7.0 | 16.0 |
| Comparative Example 3 | $Fe_3Ga$ | −19 | 2.0 | Au | 7.1 | 3.0 |
| Comparative Example 4 | $CO_2MnGa$ | −25 | 3.8 | Au | 6.8 | 3.0 |

TABLE 1-continued

| | \|ΔS\| [μV/K] | Electromotive force due to Seebeck effect Vs [mV] | Thermal electromotive force $V_N$ [mV] |
|---|---|---|---|
| Example 1 | 8.0 | 7.5 | 1.22 |
| Example 2 | 5.0 | 4.7 | 1.13 |
| Example 3 | 0.0 | 0 | 0.94 |
| Example 4 | 5.0 | 4.7 | 0.77 |
| Example 5 | 4.0 | 3.8 | 0.97 |
| Example 6 | 3.0 | 2.8 | 0.63 |
| Example 7 | 1.0 | 0.9 | 0.43 |
| Example 8 | 0.3 | 0.2 | 0.96 |
| Example 9 | 0.8 | 0.7 | 0.77 |
| Example 10 | 0.02 | 0.0 | 0.78 |
| Example 11 | 0.15 | 0.1 | 0.81 |
| Example 12 | 1.0 | 0.9 | 1.47 |
| Example 13 | 5.5 | 5.2 | 0.31 |
| Comparative Example 1 | 21.0 | 19.7 | 1.30 |
| Comparative Example 2 | 28.0 | 26.3 | 0.38 |
| Comparative Example 3 | 22.0 | 20.6 | 1.28 |
| Comparative Example 4 | 28.0 | 26.3 | 2.44 |

The invention claimed is:

1. A thermoelectric conversion element comprising:

a magneto-thermoelectric conversion body extending linearly; and a wiring electrically connected to the magneto-thermoelectric conversion body, wherein the magneto-thermoelectric conversion body and the wiring are formed of different materials, wherein the wiring comprises an alloy containing Cu and at least one selected from the group consisting of Ni, Co, Ag, Au, Al, and Fe, and wherein an absolute value of a difference between a Seebeck coefficient Sm in a length direction of the magneto-thermoelectric conversion body and a Seebeck coefficient Sc in a length direction of the wiring is 10 μV/K or less.

2. The thermoelectric conversion element according to claim 1, wherein an absolute value of the Seebeck coefficient Sm is 10 μV/K or more.

3. The thermoelectric conversion element according to claim 1, wherein the Seebeck coefficient Sm and the Seebeck coefficient Sc represent values of the same sign.

4. The thermoelectric conversion element according to claim 1, wherein the Seebeck coefficient Sc has a value of 0 or less.

5. The thermoelectric conversion element according to claim 1, wherein the wiring has a specific resistance in a range of 8 to 200 μΩ·cm.

6. The thermoelectric conversion element according to claim 1, wherein a total content of Cu, Ag, Au, Al, Ni, and Co in the wiring is 50% or more based on the number of atoms.

7. The thermoelectric conversion element according to claim 1, wherein the wiring comprises Cu and at least one element selected from the group consisting of Ni, Co, and Fe.

8. The thermoelectric conversion element according to claim 1, wherein the magneto-thermoelectric conversion body is an alloy having a body-centered cubic lattice crystal structure, the alloy containing Fe.

9. The thermoelectric conversion element according to claim 8, wherein a content of Fe in the alloy is 50% or more based on the number of atoms, and a content of the element other than Fe in the alloy is 10% or more based on the number of atoms.

10. The thermoelectric conversion element according to claim 1, wherein the magneto-thermoelectric conversion body has a plurality of first thin wires, the wiring has a plurality of second thin wires, and the first thin wires and the second thin wires are electrically connected to each other in series.

11. The thermoelectric conversion element according to claim 10, wherein the first thin wires and the second thin wires form fifty or more thin wire pairs, and each of the fifty or more thin wire pairs consists of the first thin wire and the second thin wire.

12. The thermoelectric conversion element according to claim 10, wherein the first thin wires and the second thin wires form a meander pattern.

13. A sensor comprising the thermoelectric conversion element according to claim 1.

* * * * *